(12) United States Patent
Koya et al.

(10) Patent No.: US 11,769,702 B2
(45) Date of Patent: Sep. 26, 2023

(54) AMPLIFIER MODULE

(71) Applicant: Murata Manufacturing Co., Ltd., Kyoto-fu (JP)

(72) Inventors: Shigeki Koya, Nagaokakyo (JP); Yoshimitsu Takenouchi, Nagaokakyo (JP); Kenji Sasaki, Nagaokakyo (JP); Masao Kondo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 351 days.

(21) Appl. No.: 17/224,784

(22) Filed: Apr. 7, 2021

(65) Prior Publication Data

US 2021/0327775 A1 Oct. 21, 2021

(30) Foreign Application Priority Data

Apr. 15, 2020 (JP) ................. 2020-072737

(51) Int. Cl.
*H01L 23/13* (2006.01)
*H05K 1/02* (2006.01)
*H01L 23/00* (2006.01)

(52) U.S. Cl.
CPC .............. *H01L 23/13* (2013.01); *H01L 24/13* (2013.01); *H05K 1/0298* (2013.01); *H01L 2224/1301* (2013.01); *H01L 2224/1308* (2013.01); *H01L 2924/14* (2013.01)

(58) Field of Classification Search
CPC ....... H01L 2224/1403; H01L 23/49827; H01L 23/5384; H01L 2224/01865; H01L 2224/16165; H01L 2224/16235; H01L 2224/32165; H01L 2224/32235; H01L 2224/40165; H01L 2224/40235; H01L 2224/48165
See application file for complete search history.

(56) References Cited

FOREIGN PATENT DOCUMENTS

JP 4889464 B2 3/2012
JP 2015-041760 A 3/2015

*Primary Examiner* — Amar Movva
(74) *Attorney, Agent, or Firm* — Studebaker & Brackett PC

(57) ABSTRACT

An amplifier IC mounted on a multilayer board includes input, output, and common terminals. The multilayer board includes common, input, and output terminals on board side. These terminals are connected to the corresponding terminals on device side via bumps. On the lower surface of the multilayer board, a lower surface common terminal is arranged at a location overlapping the common terminal in plan view. First, second, and third via conductors are sequentially arranged toward the lower surface common terminal from the common terminal. An input via conductor is connected to the input terminal on board side. In plan view, the area of the first common via conductor is larger than any one of the areas of the second and third common via conductors and the input via conductor. In plan view, the area of bump of the common terminal is larger than the area of bump of the input terminal.

20 Claims, 8 Drawing Sheets

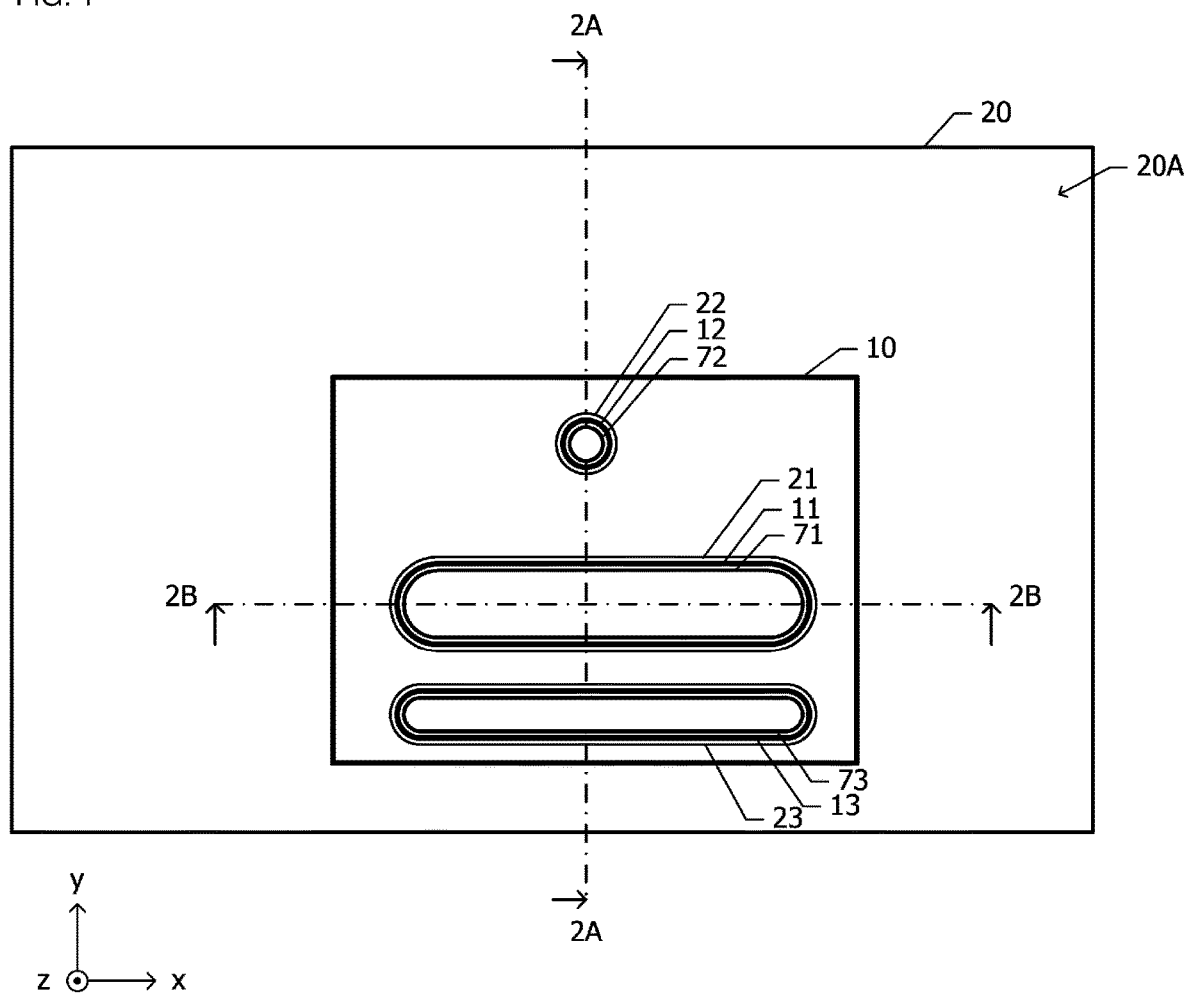

AMPLIFIER MODULE

CROSS-REFERENCE TO RELATED APPLICATION

This application claims benefit of priority to Japanese Patent Application No. 2020-072737, filed Apr. 15, 2020, the entire content of which is incorporated herein by reference.

BACKGROUND

Technical Field

The present disclosure relates to amplifier modules.

Background Art

With the introduction of the 5th generation mobile communication system (5G) or new communication standards as typified by high power user equipment (HPUE), there is a demand for larger output power. When the output power is increased, the amount of heat generated from a power amplifier also increases.

In general, a power amplifier for a wireless communication terminal is provided as an amplifier module in which a semiconductor integrated circuit device, in which a power amplifying transistor or the like is formed, is mounted on a module board together with a surface mount device (SMD) and the like. Characteristics of the integrated circuit device degrades with increase of temperature. To suppress the degradation of characteristics of the integrated circuit device, it is desirable to dissipate heat from the integrated circuit device by efficiently conducting the heat generated in the integrated circuit device to the module board.

To improve the efficiency of heat dissipation from the integrated circuit device, it is effective to arrange a via conductor within the module board directly below the integrated circuit device and use this via conductor as a heat conduction path. To reduce the thermal resistance of this heat conduction path, it is preferable to increase the number of via conductors or increase the area of horizontal cross section of the via conductor.

For example, Japanese Patent No. 4889464 discloses an electronic component in which a semiconductor chip is flip-chip mounted on a printed board. This electronic component facilitates the position alignment of the semiconductor chip at the time of mounting by increasing the height(s) of one or more of a plurality of protruded electrodes (bumps) provided on the semiconductor chip. On the top layer of insulation layers of the printed board, a depression is provided at a location corresponding to a bump having a relatively higher height, and the bump having the higher height is inserted into this depression.

SUMMARY

Because of constraints in the process, there is an upper limit in the number of via conductors provided in the module board. The number of via conductors cannot be increased beyond this upper limit. Further, in the case where the horizontal cross section of a via conductor is enlarged, the upper surface of the via conductor having a larger horizontal cross section becomes lower than the upper surfaces of other via conductors due to characteristics of a via conductor formation process. When there is variations in the heights of the upper surfaces of a plurality of via conductors, the yield of a flip-chip mounting process of semiconductor chips decreases.

Accordingly, the present disclosure provides an amplifier module that enables to stably mount an integrated circuit device incorporating an amplifier circuit on a module board and to heighten a heat dissipation property from the integrated circuit device to the module board.

According to one aspect of the present disclosure, there is provided an amplifier module including a multilayer board; an integrated circuit device mounted on the multilayer board, the integrated circuit device incorporating an amplifier circuit; and a common bump, an input bump, and an output bump that connect the multilayer board and the integrated circuit device. The integrated circuit device includes an input terminal on device side to which a radio frequency signal is input, an output terminal on the device side from which a radio frequency signal is output, and a common terminal on the device side to which a ground potential is given. The multilayer board includes a common terminal, an input terminal, and an output terminal on board side provided on a mounting surface on which the integrated circuit device is mounted. The common terminal, the input terminal, and the output terminal on the board side are arranged at locations that at least partially overlap the common terminal, the input terminal, and the output terminal on the device side in plan view, respectively. The multilayer board also includes a lower surface common terminal provided on a lower surface opposite to the mounting surface. The lower surface common terminal is arranged at a location that at least partially overlaps the common terminal on the board side in the plan view. The multilayer board further includes a first common via conductor arranged at a location that at least partially overlaps the common terminal on the board side in the plan view. The first common via conductor being directly connected to the common terminal on the board side. Also, the multilayer board includes a second common via conductor arranged at a location that at least partially overlaps the first common via conductor in the plan view. The second common via conductor is arranged at a location deeper than the first common via conductor when looking from the mounting surface, the second common via conductor is electrically connected to the first common via conductor. In addition, the multilayer board includes a third common via conductor arranged at a location that at least partially overlaps the first common via conductor in the plan view. The third common via conductor is directly connected to the lower surface common terminal, and the third common via conductor is electrically connected to the second common via conductor. Furthermore, the multilayer board includes a first input via conductor directly connected to the input terminal on the board side. The common bump connects the common terminal on the device side and the common terminal on the board side, the input bump connects the input terminal on the device side and the input terminal on the board side, and the output bump connects the output terminal on the device side and the output terminal on the board side. An area of the first common via conductor in the plan view is larger than any one of areas of the second common via conductor, the third common via conductor, and the first input via conductor in the plan view. Also, an area of the common bump in the plan view is larger than an area of the input bump in the plan view.

Heat is conducted from the integrated circuit device to the multilayer board through the common terminal on the device side, the common bump, and the common terminal on the board side. A hypothetical heat conduction path starting from the common bump is formed in the multilayer board. The hypothetical heat conduction path gradually expands toward a deeper direction from the mounting surface of the multilayer board. Therefore, the heat conduction path in a shallow region of the multilayer board becomes a bottleneck of heat dissipation. The thermal resistance of the heat conduction path can be reduced at the bottleneck part by enlarging the area of the first common via conductor arranged in the shallow region in the plan view. This enables the improvement of the characteristic of heat dissipation.

When the area of the first common via conductor in the horizontal cross section is made larger, the upper surface of the first common via conductor is likely to become lower in an innermost part than in an outer perimeter part or lower than the upper surface of the first input via conductor and the like. Because the area of the common bump in the plan view is larger than the area of the input bump in the plan view, a solder layer located on the topmost layer of the common bump is likely to become relatively thicker. That is to say, the height of the common bump is likely to become higher than the height of the input bump and the like. Because the first common via conductor whose upper surface is likely to become lower is connected to the common bump whose height is likely to become higher, the stable mounting becomes possible.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 1 is a schematic diagram illustrating a two-dimensional spatial relationship of constituent elements of an amplifier module according to a first working example;

DETAILED DESCRIPTION

First Working Example

Figure 2A:
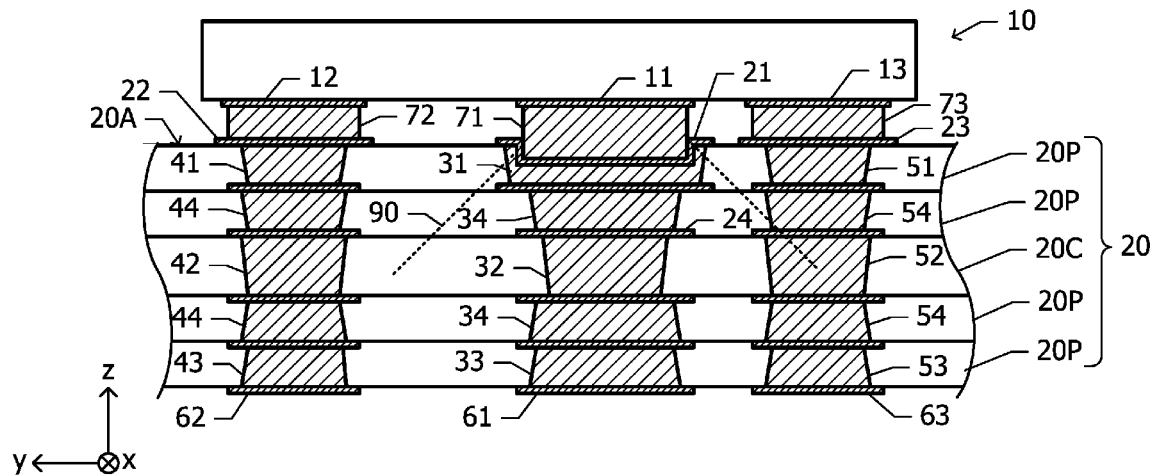
FIG. 2A is a cross-sectional diagram at a dashed-dotted line 2A-2A of FIG. 1.
Figure 2B:
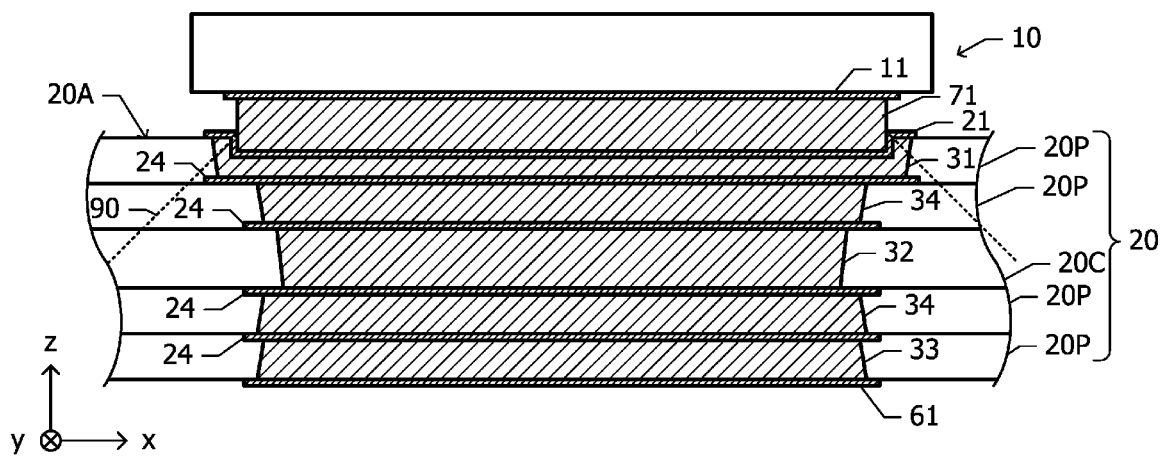
FIG. 2B is a cross-sectional diagram at a dashed-dotted line 2B-2B of FIG. 1.
Figure 2C:
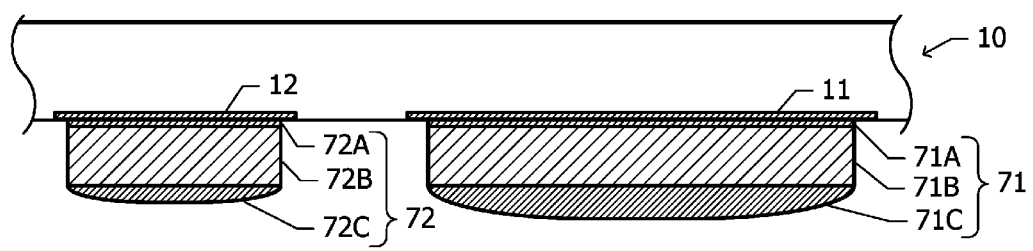
FIG. 2C is a cross-sectional diagram of a common bump and an input bump before an integrated circuit device is mounted on a multilayer board.
Figure 3:
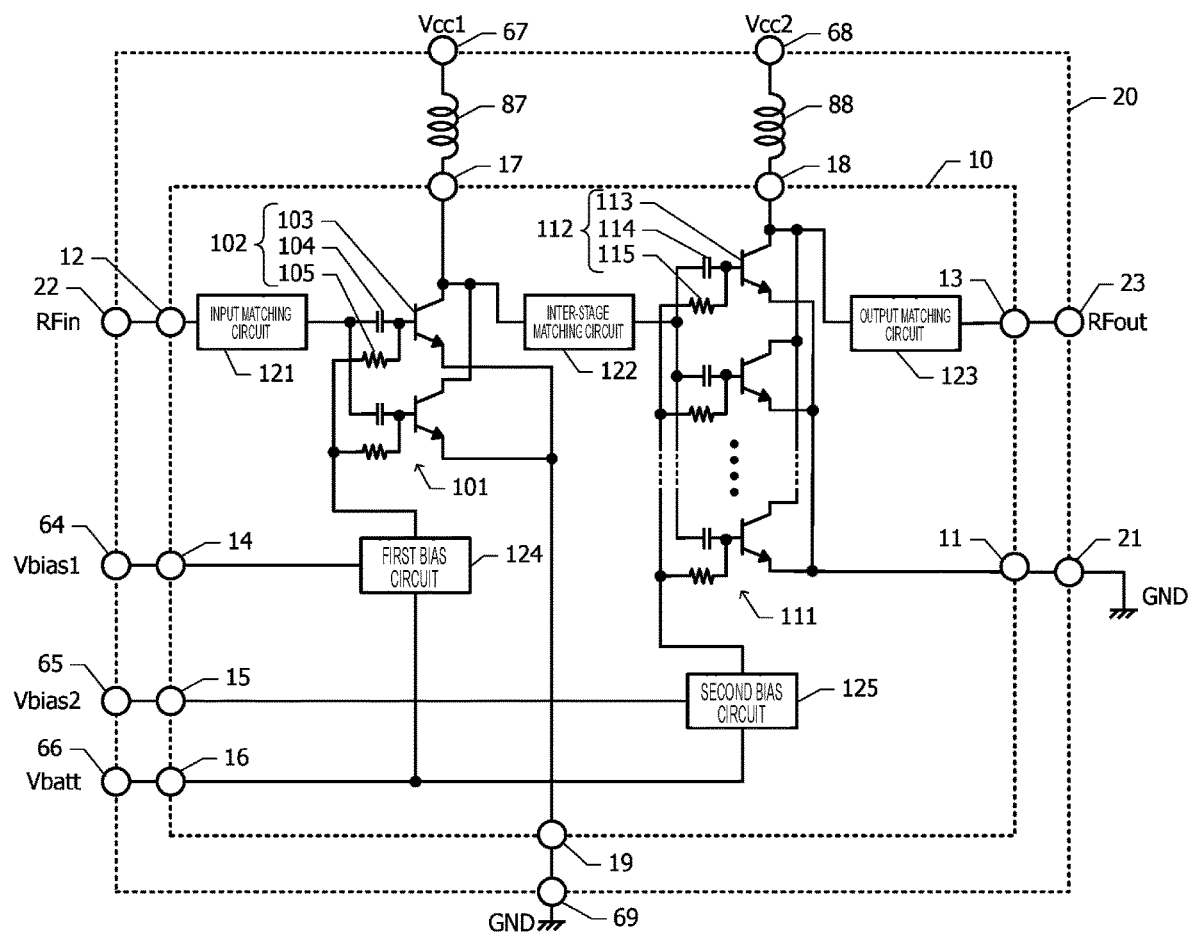
FIG. 3 is an equivalent circuit diagram of an amplifier module according to the first working example.

Referring to the drawing from FIG. 1 to FIG. 3, an amplifier module according to a first working example is described. FIG. 1 is a schematic diagram illustrating a two-dimensional spatial relationship of constituent elements of the amplifier module according to the first working example. An integrated circuit device 10 incorporating an amplifier circuit is mounted on a mounting surface 20A of a multilayer board 20. A xyz orthogonal coordinate system is defined in such a way that the mounting surface 20A is defined as the xy-plane and the outward normal direction to the mounting surface 20A is defined as the positive direction of the z-axis. On a surface of the integrated circuit device 10 opposite to the multilayer board 20, a common terminal 11, an input terminal 12, and an output terminal 13 are provided. In the plan view, the input terminal 12 has substantially a circular shape, and the common terminal 11 and the output terminal 13 each have substantially an elongated shape in one direction (x-axis direction). The lengthwise directions of the common terminal 11 and the output terminal 13 are substantially parallel to each other. A radio frequency signal is input from the input terminal 12 to the integrated circuit device 10, and a radio frequency signal amplified by the integrated circuit device 10 is output from the output terminal 13. A ground potential is given to the common terminal 11.

On the mounting surface 20A of the multilayer board 20, a common terminal 21, an input terminal 22, and an output terminal 23 are provided. In order to distinguish between the common terminal 11 provided on the integrated circuit device 10 and the common terminal 21 provided on the multilayer board 20, in some cases, the common terminal 11 provided on the integrated circuit device 10 is referred to as the "common terminal 11 on the device side", and the common terminal 21 provided on the multilayer board 20 is referred to as the "common terminal 21 on the board side". The same applies to the input terminals 12 and 22 and the output terminals 13 and 23.

The common terminal 21, the input terminal 22, and the output terminal 23 on the board side partially and the common terminal 11, the input terminal 12, and the output terminal 13 on the device side overlap each other in the plan view, respectively. Here, "two members overlap each other in the plan view" means that at least part of one of the two members overlaps at least part of the other member when looking a board from the direction vertical to a surface of the board. The common terminal 11, the input terminal 12, and the output terminal 13 on the device side are connected to the common terminal 21, the input terminal 22, and the output terminal 23 on the board side via a common bump 71, an input bump 72, and an output bump 73, respectively. As is the case with the common terminal 11 and the output terminal 13 on the device side, the common bump 71 and the output bump 73 each have substantially an elongated shape in one direction in the plan view.

FIG. 2A and FIG. 2B are cross-sectional diagrams at a dashed-dotted line 2A-2A and a dashed-dotted line 2B-2B of FIG. 1, respectively. The multilayer board 20 includes an insulation layer 20C at the center and insulation layers 20P on both sides thereof. Two insulation layers 20P are stacked on both the upper side and the lower side of the insulation layer 20C. That is to say, the multilayer board 20 includes five insulation layers 20C and 20P in total. The surface that faces the substantially the same direction as the direction that the mounting surface 20A of the multilayer board 20 faces is referred to as an upper surface, and the surface that faces the opposite direction is referred to as a lower surface.

A plurality of inner layer conductor patterns 24 is provided on each of the upper surface and the lower surface of the insulation layer 20C at the center and boundaries between the insulation layers 20P adjacent to each other in the up-down direction. The upper surface of the topmost insulation layer 20P corresponds to the mounting surface 20A. On the mounting surface 20A, the common terminal 21, the input terminal 22, and the output terminal 23 are provided. On the lower surface of the multilayer board 20, a lower surface common terminal 61, a lower surface input terminal 62, and a lower surface output terminal 63 are provided.

In the topmost insulation layer 20P, a first common via conductor 31, a first input via conductor 41, and a first output via conductor 51 are arranged. In the insulation layer 20C at the center, a second common via conductor 32, a second input via conductor 42, and a second output via conductor 52 are arranged. That is to say, the second common via conductor 32, the second input via conductor 42, and the second output via conductor 52 are arranged at locations deeper than the first common via conductor 31, the first input via conductor 41, and the first output via conductor 51 when looking from the mounting surface 20A. In the downmost insulation layer 20P, a third common via conductor 33, a third input via conductor 43, and a third output via conductor 53 are arranged. That is to say, when looking from the mounting surface 20A, the third common via conductor 33, the third input via conductor 43, and the third output via conductor 53 are arranged at locations deeper than the second common via conductor 32, the second input via conductor 42, and the second output via conductor 52, respectively. Furthermore, a common via conductor 34, an input via conductor 44, and an output via conductor 54 are arranged in each of two insulation layers 20P that are arranged above and below the insulation layer 20C at the center in such a manner as to be in contact with the insulation layer 20C at the center.

The common terminal 21, the first common via conductor 31, the second common via conductor 32, the third common via conductor 33, the lower surface common terminal 61, and the common via conductor 34 are arranged at locations where they overlap each other in the plan view. Here, "a plurality of members overlap each other in the plan view" means that at least part of one of the plurality of members overlaps at least parts of the remaining members when looking a plane from the direction vertical to the plane. Note that even when there is position deviation that is within an acceptable range during a fabrication process of the multilayer board 20, the common terminal 21, the first common via conductor 31, the second common via conductor 32, the third common via conductor 33, the lower surface common terminal 61, and the common via conductor 34 overlap each other in the plan view. The inner layer conductor pattern 24 is arranged between the via conductors adjacent to each other in the thickness direction. The first common via conductor 31 is directly connected to the common terminal 21. That is to say, the common terminal 21 is in contact with an upper surface of the first common via conductor 31. The second common via conductor 32 is electrically connected to the first common via conductor 31 via the inner layer conductor patterns 24 arranged on the second common via conductor 32 and the common via conductor 34. The third common via conductor 33 is electrically connected to the second common via conductor 32 via the inner layer conductor patterns 24 arranged on the third common via conductor 33 and the common via conductor 34. Furthermore, the third common via conductor 33 is directly connected to the lower surface common terminal 61.

The first input via conductor 41 is directly connected to the input terminal 22. The second input via conductor 42 is electrically connected to the first input via conductor 41. The third input via conductor 43 is electrically connected to the second input via conductor 42 and also directly connected to the lower surface input terminal 62.

The first output via conductor 51 is directly connected to the output terminal 23. The second output via conductor 52 is electrically connected to the first output via conductor 51. The third output via conductor 53 is electrically connected to the second output via conductor 52 and also directly connected to the lower surface output terminal 63.

Here, "the configuration in which two members are electrically connected to each other" includes the configuration in which two members are directly connected to each other and the configuration in which two members are connected to each other via another via conductor, an inner layer land, or the like. "The configuration in which two members are directly connected to each other" includes, in the case where at least one of the two members includes a multilayer structure, the configuration in which one of layers of the multilayer structure of one member is in contact with the other member, and the remaining layers are not in contact with the other member.

The common terminal 11 on the device side and the common terminal 21 on the board side are connected to each other via the common bump 71. The input terminal 12 on the device side and the input terminal 22 on the board side are connected to each other via the input bump 72. The output terminal 13 on the device side and the output terminal 23 on the board side are connected to each other via the output bump 73.

The common terminal 21, the common bump 71, the first common via conductor 31, the second common via conductor 32, the third common via conductor 33, and the other common via conductors 34 on the board side each have substantially an elongated shape in one direction in the plan view as is the case with the common terminal 11 on the device side. The output terminal 23, the output bump 73, the first output via conductor 51, the second output via conductor 52, the third output via conductor 53, and the other output via conductors 54 on the board side each have substantially an elongated shape in one direction in the plan view as is the case with the output terminal 13 on the device side.

Generally, the multilayer board 20 is fabricated using a buildup method. Next, an outline of the buildup method is described. The insulation layer 20C at the center is referred to as a core layer. First, the second common via conductor 32, the second input via conductor 42, the second output via conductor 52, and the inner layer conductor patterns 24 on the upper surface and the lower surface of the core layer are formed on or in the core layer. Next, a prepreg thinner than the core layer is attached on both sides of the core layer and cured. The common via conductor 34, the input via conductor 44, the output via conductor 54, and the inner layer conductor patterns 24 are formed on or in the cured prepreg.

Furthermore, a prepreg is attached on above and below and cured. The first common via conductor 31, the first input via conductor 41, the first output via conductor 51, the common terminal 21, the input terminal 22, and the output terminal 23 are formed on or in the topmost prepreg. The third common via conductor 33, the third input via conductor 43, the third output via conductor 53, the lower surface common terminal 61, the lower surface input terminal 62, and the lower surface output terminal 63 are formed on or in the downmost prepreg.

A laser or a mechanical drill is used in a hole boring process for forming a via conductor in the prepreg. A via conductor is formed by filling a formed hole with a metal using plating. The inner layer conductor patterns 24, the first common via conductor 31, and the like are formed by copper foil patterning or copper plating. The holes provided in the insulation layer 20C at the center each have, for example, a shape such that the opening at the upper surface is larger than the opening at the lower surface. The holes provided in the insulation layer 20P, which is formed from the prepreg, each have a shape such that the hole expands toward a direction away from the insulation layer 20C at the center.

In the plan view, the width (dimension in the left-right direction in FIG. 2A) of the first common via conductor 31 is wider than any of the widths of the common bump 71, the second common via conductor 32, and the third common via conductor 33. Here, the width of each constituent element in the plan view is defined to mean the width (dimension in the shorter direction (y-axis direction)) of an image of the constituent element vertically projected onto a hypothetical plane (plane parallel to the xy-plane) orthogonal to the thickness direction (z-axis direction) of the multilayer board 20. Note that in the case where a vertically projected image has a shape in which the longer direction and the shorter direction cannot be defined, such as a square, a circle, or the like, the length of one side of the square or the diameter of the circle is defined as the width. The width of the first common via conductor 31 in the plan view is wider than any of the diameter of the first input via conductor 41 and the width of the first output via conductor 51 in the plan view.

The area of the first common via conductor 31 in the plan view is larger than any of the areas of the second common via conductor 32, the third common via conductor 33, the first input via conductor 41, and the first output via conductor 51 in the plan view. Here, the area of a constituent element in the plan view is defined to mean the area of an image of the constituent element vertically projected onto a hypothetical plane orthogonal to the thickness direction of the multilayer board 20. The area of the common bump 71 in the plan view is larger than any of the areas of the input bump 72 and the output bump 73 in the plan view. The area of the third common via conductor 33 in the plan view is larger than or equal to the area of the second common via conductor 32 in the plan view.

The area of the first common via conductor 31 in the plan view is larger than the area of the common bump 71 in the plan view. In the plan view, the first common via conductor 31 contains the common bump 71.

The hole for filling the first common via conductor 31 is larger than the other holes, and thus the filled amount of the first common via conductor 31 likely to become insufficient compared with the filled amounts of the first input via conductor 41 and the first output via conductor 51. Because of an insufficient filled amount of the first common via conductor 31, the upper surface of the first common via conductor 31 is lower in an innermost part than in an outer perimeter part. Furthermore, the innermost part of the upper surface of the first common via conductor 31 is lower than the upper surfaces of the first input via conductor 41 and the first output via conductor 51. The upper surface of the common terminal 21 is also lower in an innermost part than in an outer perimeter part, reflecting the shape of the upper surface of the first common via conductor 31. The innermost part of the upper surface of the common terminal 21 is lower than the upper surfaces of the input terminal 22 and the output terminal 23.

FIG. 2C is a cross-sectional diagram of the common bump 71 and the input bump 72 before the integrated circuit device 10 is mounted on the multilayer board 20. The common bump 71 includes an underlying layer 71A, a Cu pillar 71B, and a solder layer 71C, which are stacked in sequence from the common terminal 11. Similarly, the input bump 72 includes an underlying layer 72A, a Cu pillar 72B, and a solder layer 72C. A bump having such a structure is referred to as a Cu pillar bump.

Because the width of the common bump 71 is wider than the diameter of the input bump 72, the height of the solder layer 71C placed on the top surface of the Cu pillar 71B (surface facing the opposite side of the surface facing the common terminal 11 on the device side) is higher than the height of the solder layer 72C placed on the top surface of the Cu pillar 72B. That is to say, the height of the common bump 71 is higher than the height of the input bump 72. Similarly, the height of the common bump 71 is higher than the height of the output bump 73 (FIG. 2A). It also can be said that the amount of solder in the solder layer 71C per unit area of the Cu pillar 71B of the common bump 71 is greater than the amount of solder in the solder layer 72C per unit area of the Cu pillar 72B of the input bump 72.

At the time of mounting the integrated circuit device 10 on the multilayer board 20, the solder layers 71C and 72C melt first and then solidify. Because the height of the innermost part of the upper surface of the first common via conductor 31 is lower than the height of the upper surface of the first input via conductor 41, the height of the common bump 71 is higher than the height of the input bump 72 even in the state where the integrated circuit device 10 is mounted on the multilayer board 20.

FIG. 3 is an equivalent circuit diagram of an amplifier module according to the first working example. The integrated circuit device 10 includes a driver stage amplifier circuit 101, a power stage amplifier circuit 111, an input matching circuit 121, an inter-stage matching circuit 122, an output matching circuit 123, a first bias circuit 124, and a second bias circuit 125.

The driver stage amplifier circuit 101 includes two cells 102 connected in parallel to each other. Each of the cells 102 includes a transistor 103, an input capacitor 104, and a base ballast resistor 105. The power stage amplifier circuit 111 includes a plurality of cells 112 connected in parallel to each other. Each of the cells 112 includes a transistor 113, an input capacitor 114, and a base ballast resistor 115.

A radio frequency signal input from the input terminal 12 on the device side is input to a base of the transistor 103 via the input matching circuit 121 and the input capacitor 104. A radio frequency signal output from a collector of the transistor 103 is input to a base of the transistor 113 via the inter-stage matching circuit 122 and the input capacitor 114. A radio frequency signal output from a collector of the transistor 113 is output to outside from the output terminal 13 on the device side via the output matching circuit 123.

The first bias circuit 124 supplies a bias current to the transistor 103 via the base ballast resistor 105. The second bias circuit 125 supplies a bias current to the transistor 113 via the base ballast resistor 115.

An emitter of the transistor 113 of the power stage amplifier circuit 111 is connected to the common terminal 11 on the device side. An emitter of the transistor 103 of the driver stage amplifier circuit 101 is connected to a driver stage common terminal 19.

The integrated circuit device 10 includes a first bias terminal 14, a second bias terminal 15, a bias power supply terminal 16, a driver stage power supply terminal 17, and a power stage power supply terminal 18 on the device side in addition to the common terminal 11, the input terminal 12, the output terminal 13 (FIG. 1 and FIG. 2A). On the mounting surface 20A of the multilayer board 20 (FIG. 2A), a first bias terminal 64, a second bias terminal 65, a bias power supply terminal 66, and a driver stage common terminal 69 on the board side are provided in addition to the common terminal 21, the input terminal 22, the output terminal 23 (FIG. 1 and FIG. 2A). Furthermore, on the lower surface of the multilayer board 20, a driver stage power supply terminal 67 and a power stage power supply terminal 68 are provided.

As illustrated in FIG. 2A, the common terminal 11, the input terminal 12, and the output terminal 13 on the device side are connected to the common terminal 21, the input terminal 22, and the output terminal 23 on the board side, respectively. The first bias terminal 14, the second bias terminal 15, the bias power supply terminal 16, and the driver stage common terminal 19 on the device side are connected to the first bias terminal 64, the second bias terminal 65, the bias power supply terminal 66, and the driver stage common terminal 69 on the board side, respectively. Each terminal on the device side is connected to the corresponding terminal on the board side via a bump.

The driver stage power supply terminal 17 on the device side is connected to the driver stage power supply terminal 67 on the lower surface via an inductor 87 and one or more corresponding terminals and via conductors on the board side. The power stage power supply terminal 18 on the device side is connected to the power stage power supply terminal 68 on the lower surface via an inductor 88 and one or more corresponding terminals and via conductors on the board side. The inductors 87 and 88 are surface-mounted on the mounting surface 20A of the multilayer board 20.

A power supply voltage Vcc1 is applied to the transistor 103 in the driver stage from the driver stage power supply terminal 67 provided on the lower surface of the multilayer board 20 via the inductor 87. A power supply voltage Vcc2 is applied to the transistor 113 in the power stage from the power stage power supply terminal 68 provided on the lower surface of the multilayer board 20 via the inductor 88.

A first bias control signal Vbias1 is input to the first bias circuit 124 from the first bias terminal 64 on the board side via the first bias terminal 14 on the device side. A second bias control signal Vbias2 is input to the second bias circuit 125 from the second bias terminal 65 on the board side via the second bias terminal 15 on the device side. A bias power Vbatt is supplied to the first bias circuit 124 and the second bias circuit 125 from the bias power supply terminal 66 on the board side via the bias power supply terminal 16 on the device side.

The first bias circuit 124 supplies a bias current to the transistor 103 in the driver stage based on the first bias control signal Vbias1. The second bias circuit 125 supplies a bias current to the transistor 113 in the power stage based on the second bias control signal Vbias2.

The ground potential is given to the emitter of the transistor 113 in the power stage from the common terminal 21 on the board side via the common terminal 11 on the device side. The ground potential is given to the emitter of the transistor 103 in the driver stage from the driver stage common terminal 69 on the board side via the driver stage common terminal 19 on the device side.

Next, advantageous effects of the first working example are described. During the operation of the integrated circuit device 10, the plurality of transistors 113 in the power stage (FIG. 3) will be a major heat source. The heat generated by the plurality of transistors 113 in the power stage diffuses into the multilayer board 20 via, mostly, the common terminal 11, the common bump 71, and the first common via conductor 31. In the first working example, the area of the common bump 71 (FIG. 2A and FIG. 2B) in the plan view is larger than the areas of the input bump 72 and the output bump 73 in the plan view. That is to say, the heat conduction path from the integrated circuit device 10 to the multilayer board 20 is thicker. Therefore, the thermal resistance of the heat conduction path from the integrated circuit device 10 to the multilayer board 20 is lower. This enables to suppress the rise in temperature of the integrated circuit device 10.

In the first working example, in response to the enlargement of the area of the common bump 71 in the plan view, the area of the first common via conductor 31 (FIG. 2A and FIG. 2B) in the plan view is enlarged. In the case where the area of the first common via conductor 31 in the plan view becomes larger, the innermost part of the upper surface of the first common via conductor 31 becomes lower than the outer perimeter part of the upper surface of the first common via conductor 31 and the upper surfaces of the first input via conductor 41 and the first output via conductor 51 whose areas in the plan view are smaller.

In the first working example, in response to the lowering of the innermost part of the upper surface of the first common via conductor 31, the height of the common bump 71 is made higher than the heights of the input bump 72 and the output bump 73. That is to say, variations in the heights of the upper surfaces of the first common via conductor 31, the first input via conductor 41, and the first output via conductor 51 are absorbed by adjusting the heights of the common bump 71, the input bump 72, and the output bump 73. Therefore, even in the case where the areas of the common bump 71 and the first common via conductor 31 in the plan view are enlarged, it becomes possible to mount the integrated circuit device 10 on the multilayer board 20 with stability.

Figure 4A:
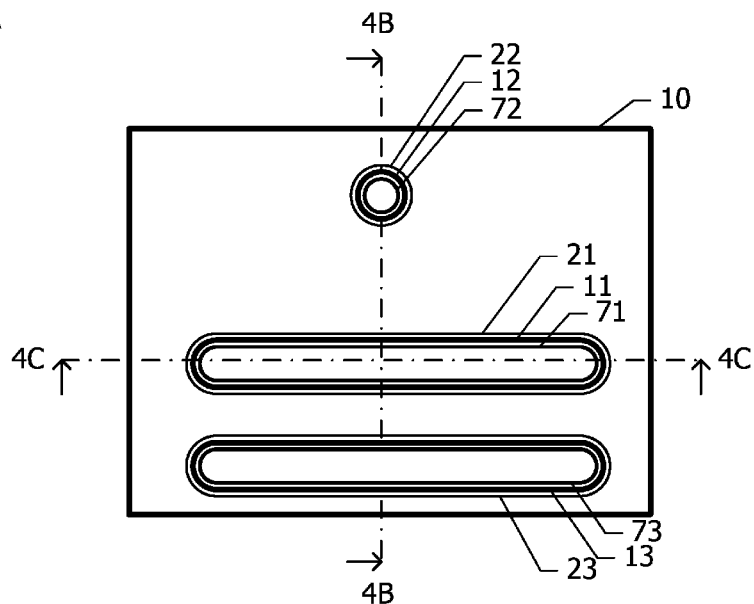
FIG. 4A is a schematic diagram illustrating a two-dimensional spatial relationship of constituent elements of an amplifier module according to a first comparative example.
Figure 4B:
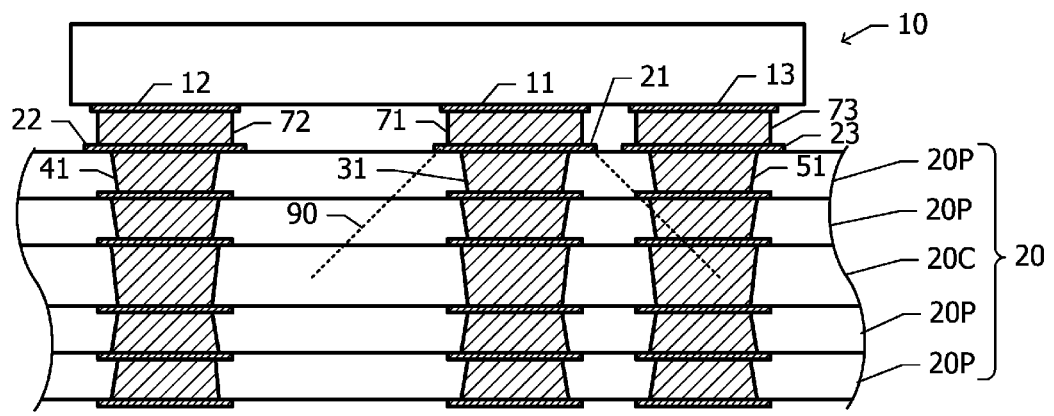
FIG. 4B is a cross-sectional diagram at a dashed-dotted line 4B-4B of FIG. 4A.
Figure 4C:
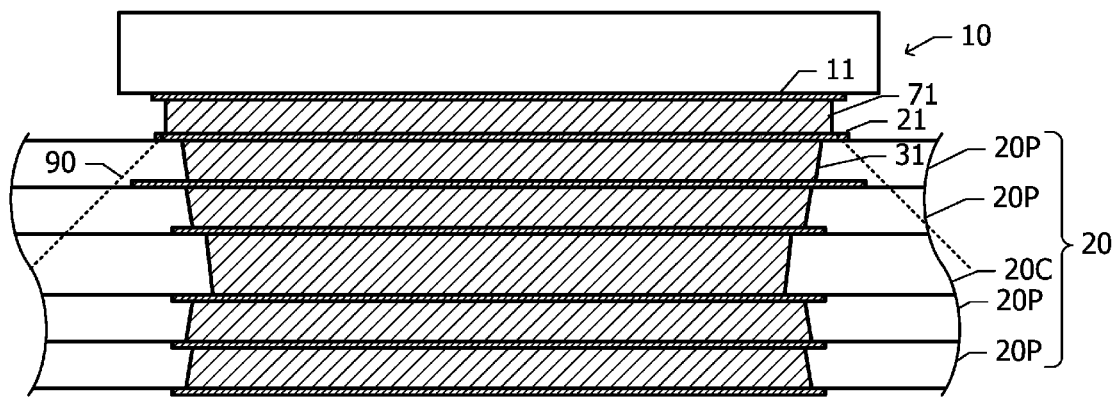
FIG. 4C is a cross-sectional diagram at a dashed-dotted line 4C-4C of FIG. 4A.
Figure 5A:
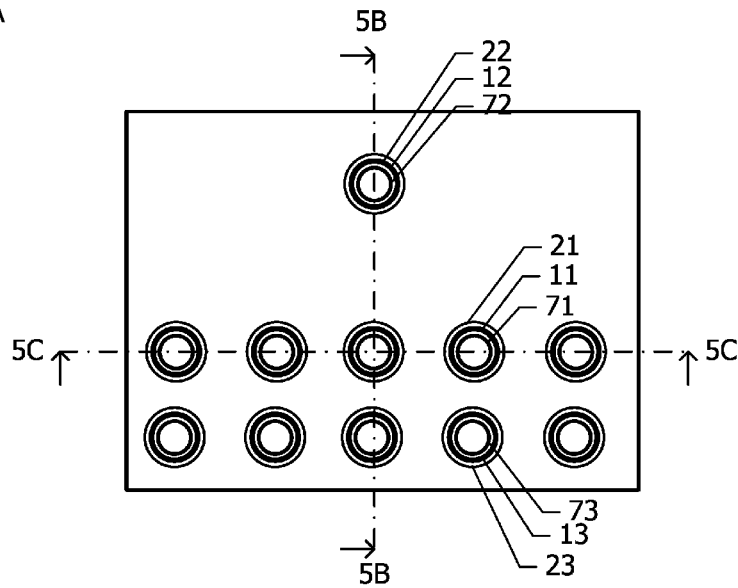
FIG. 5A is a schematic diagram illustrating a two-dimensional spatial relationship of constituent elements of an amplifier module according to a second comparative example.
Figure 5B:
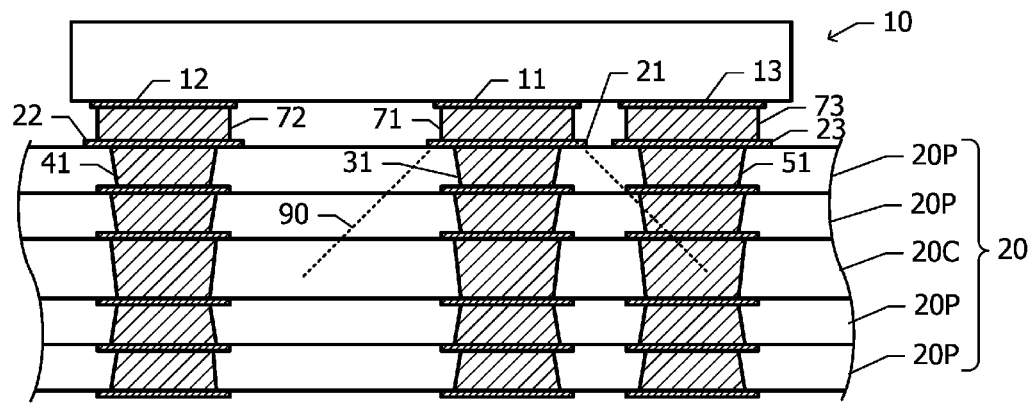
FIG. 5B is a cross-sectional diagram at a dashed-dotted line 5B-5B of FIG. 5A.
Figure 5C:
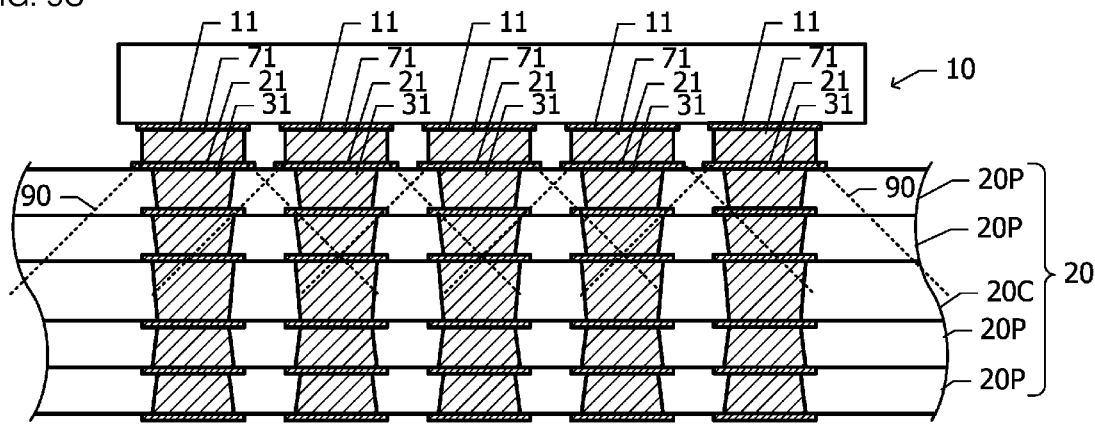
FIG. 5C is a cross-sectional diagram at a dashed-dotted line 5C-5C of FIG. 5A.

Next, advantageous effects of the first working example are described while comparing with a first comparative example illustrated in FIG. 4A, FIG. 4B, and FIG. 4C and a second comparative example illustrated in FIG. 5A, FIG. 5B, and FIG. 5C.

FIG. 4A is a schematic diagram illustrating a two-dimensional spatial relationship of constituent elements of an amplifier module according to the first comparative example. FIG. 4B and FIG. 4C are cross-sectional diagrams at a dashed-dotted line 4B-4B and a dashed-dotted line 4C-4C of FIG. 4A, respectively. In the first comparative example, the areas of the first common via conductor 31 and the first output via conductor 51 in the plan view are both substantially equal to the area of the first output via conductor 51 according to the first working example (FIG. 2A and FIG. 2B) in the plan view. Therefore, the upper surface of the first common via conductor 31 is substantially flat and is located at substantially the same height as the upper surfaces of the first input via conductor 41 and the first output via conductor 51.

FIG. 5A is a schematic diagram illustrating a two-dimensional spatial relationship of constituent elements of an amplifier module according to the second comparative example. FIG. 5B and FIG. 5C are cross-sectional diagrams at a dashed-dotted line 5B-5B and a dashed-dotted line 5C-5C of FIG. 5A, respectively. In the second comparative example, a plurality of common bumps 71 and a plurality of output bumps 73 are arranged. In response to the plurality of common bumps 71 and the plurality of output bumps 73, a plurality of first common via conductors 31 and a plurality of first output via conductors 51 are also arranged. The dimension of each of the plurality of first common via conductors 31 and the plurality of first output via conductors 51 in the plan view is substantially equal to the dimension of the first input via conductor 41 in the plan view. Therefore, the upper surface of each of the plurality of first common via conductors 31 and the plurality of first output via conductors 51 is located at substantially the same height as the upper surface of the first input via conductor 41.

The dimension of each of the plurality of common bumps 71 and the plurality of output bumps 73 in the plan view is substantially equal to the dimension of the input bump 72 in the plan view. Therefore, the height of each of the plurality of common bumps 71 and the plurality of output bumps 73 is substantially the same as the height of the input bump 72.

In both the first comparative example and the second comparative example, in the plan view, the first common via conductor 31 is smaller than the common bump 71 and is contained in the common bump 71. Therefore, there is part where the first common via conductor 31 is not present directly below the outer perimeter part of the common bump 71. At this part, an insulation material that forms the insulation layer 20P is placed.

The heat that has been conducted from the integrated circuit device 10 to the multilayer board 20 through the common bump 71 spreads out in an in-plane direction of the multilayer board 20 while conducting in the thickness direction of the multilayer board 20. A path starting from the common bump 71, along which a major part of heat flows, is assumed as a hypothetical heat conduction path 90. In FIG. 2A, FIG. 2B, FIG. 4B, FIG. 4C, FIG. 5B, and FIG. 5C, the heat conduction path 90 is denoted by a dashed line. The horizontal cross section of the heat conduction path 90 gradually expands toward a back surface from the mounting surface 20A. The shallower the region of the multilayer board 20 is, the smaller the cross section of the heat conduction path 90 becomes. Therefore, the thermal resistance of the heat conduction path 90 in a shallow region of the multilayer board 20 becomes a bottleneck of heat dissipation.

In the first comparative example and the second comparative example, there is a region where the first common via conductor 31 is not present directly below the outer perimeter part of the common bump 71. In contrast, in the first working example, the first common via conductor 31 is present directly below the entire area the common bump 71. Furthermore, in the plan view, the first common via conductor 31 expands to the outside of the common bump 71. The thermal conductivity of the first common via conductor 31 is larger than the thermal conductivity of the insulation layer 20P. Therefore, compared with the first comparative example and the second comparative example, in the first working example, the thermal resistance of the hypothetical heat conduction path 90 decreases in the shallow region that becomes a bottleneck of heat dissipation. This enables to improve the characteristic of heat dissipation from the integrated circuit device 10 to the lower surface of the multilayer board 20 in the first working example compared with the first comparative example and the second comparative example.

In the first working example, the areas of the second common via conductor 32, the third common via conductor 33, and other common via conductors 34 (FIG. 2A) in the plan view are smaller than the area of the first common via conductor 31 in the plan view. Note that in all the insulation layers 20P and 20C except the topmost insulation layer 20P of the multilayer board 20, the horizontal cross sections of the heat conduction path 90 are larger than the horizontal cross section of the heat conduction path 90 in the topmost insulation layer 20P. In deeper regions where the heat conduction path 90 is expanded, effects of the second common via conductor 32, the third common via conductor 33, and the other common via conductors 34 (FIG. 2A) on the thermal resistance are smaller. Therefore, it becomes possible to keep the thermal resistance of the hypothetical heat conduction path 90 at a sufficiently low level.

Next, a modified example of the first working example is described. In the first working example, the multilayer board 20 (FIG. 2A and FIG. 2B) is made up of five insulation layers 20C and 20P in total. Alternatively, the multilayer board 20 may be made up of three layers in total, in which one insulation layer 20P is arranged above and below the insulation layer 20C at the center. The total of six or more layers of the insulation layers 20C and 20P may also be used.

In the first working example, various via conductors are each expanding toward one surface of each of the insulation layers 20C and 20P from the other surface thereof. As an alternative configuration, the via conductors may each have a shape in which the size of horizontal cross section of the via conductor is constant along the thickness direction. Such shape of the via conductor can be realized, for example, by adjusting process conditions when forming holes in the insulation layers 20C and 20P.

In the first working example, the common bump 71, the input bump 72 (FIG. 2C), and the like each have the structure in which the Cu pillar and the solder layer are included. However, a bump having a different structure may also be used. For example, an Au bump may be used for the common bump 71, the input bump 72, and the like.

In the first working example, the integrated circuit device 10 incorporates the input matching circuit 121 and the output matching circuit 123 (FIG. 3). Alternatively, at least part of at least one of the input matching circuit 121 and the output matching circuit 123 may be surface-mounted on the mounting surface 20A of the multilayer board 20. For example, in the case where at least part of the output matching circuit 123 is mounted on the mounting surface 20A of the multilayer board 20, the output terminal 23 on the board side (FIG. 2A) may be connected to an input port of the output matching circuit 123 on the mounting surface 20A via a wiring line formed on the mounting surface 20A without connecting to the first output via conductor 51, and an output port of the output matching circuit 123 on the mounting surface 20A may be connected to one of the first output via conductor 51, the second output via conductor 52, the third output via conductor 53, and the output via conductor 54.

Second Working Example

Figure 6:
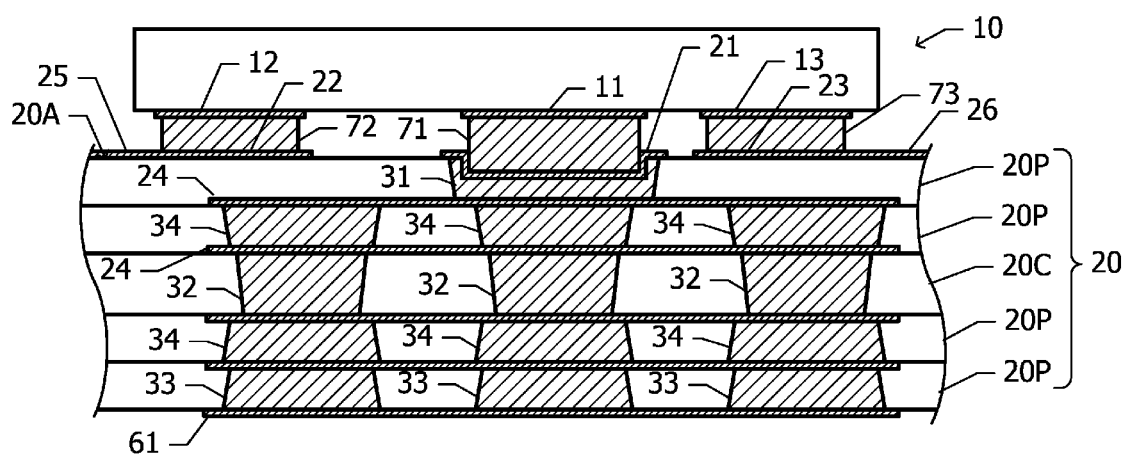
FIG. 6 is a cross-sectional diagram of an amplifier module according to a second working example.

Next, referring to FIG. 6, an amplifier module according to a second working example is described. Hereinafter, the description regarding the configuration common to the amplifier module according to the first working example (drawings from FIG. 1 to FIG. 3) is omitted.

FIG. 6 is a cross-sectional diagram of an amplifier module according to the second working example. In the first working example, the first input via conductor 41 and the first output via conductor 51 (FIG. 2A) are arranged at locations that overlap the input bump 72 and the output bump 73 in the plan view, respectively. In contrast, in the second working example, no via conductors to be connected to the input bump 72 and the output bump 73 are arranged at locations that overlap the input bump 72 and the output bump 73 in the plan view.

A plurality of common via conductors 34, a plurality of second common via conductors 32, and a plurality of third common via conductors 33, which are connected to the first common via conductor 31, are arranged in the insulation layers 20P and 20C except the topmost insulation layer 20P. Some of the second common via conductors 32, the third common via conductors 33, and the common via conductors 34 are arranged at locations that overlap the input bump 72 or the output bump 73 in the plan view. The plurality of second common via conductors 32, the plurality of third common via conductors 33, and the plurality of common via conductors 34 provided in the respective insulation layers 20P and 20C are connected in the in-plane direction via the inner layer conductor patterns 24.

An input wiring line 25 and an output wiring line 26 respectively connected to the input terminal 22 and the output terminal 23 on the board side are extended up to regions where the common via conductor 34 is not present in the plan view. The input wiring line 25 and the output wiring line 26 are connected to the lower surface input terminal 62 and the lower surface output terminal 63 (FIG. 2A) in the regions where the common via conductor 34 is not present, respectively.

Next, advantageous effects of the second working example are described. As is the case with the first working example, in the second working example, it also becomes possible to mount the integrated circuit device 10 on the multilayer board 20 with stability and improve the characteristic of heat dissipation from the integrated circuit device 10 to the lower surface of the multilayer board 20. Furthermore, compared with the first working example, in the second working example, larger numbers of the common via conductors 34, the second common via conductors 32, and the third common via conductors 33 are provided in inner insulation layers 20C and 20P of the multilayer board 20 and the downmost insulation layer 20P. Therefore, it becomes possible to further reduce the thermal resistance of the heat conduction path.

Third Working Example

Figure 7:
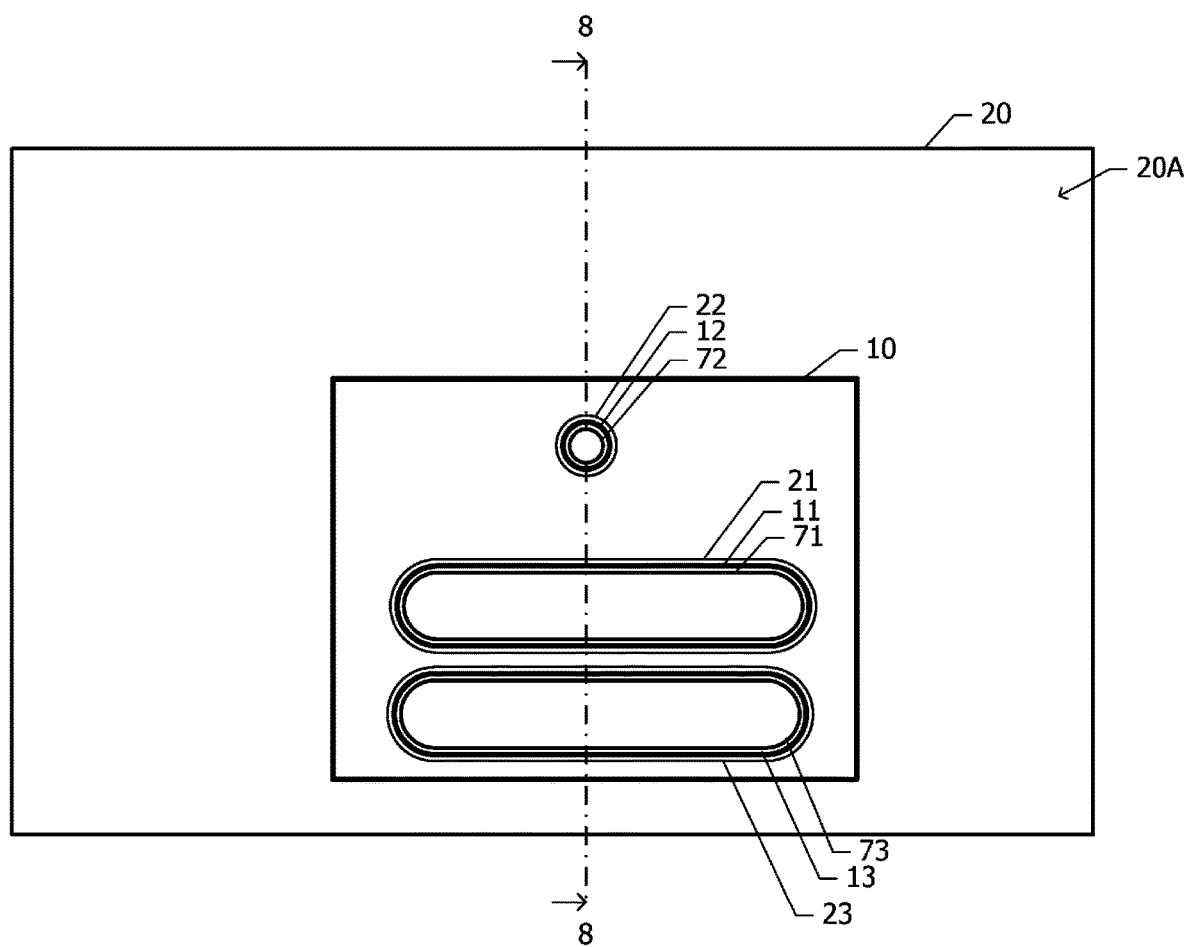
FIG. 7 is a diagram illustrating a spatial relationship in a plan view of constituent elements of an amplifier module according to a third working example.
Figure 8:
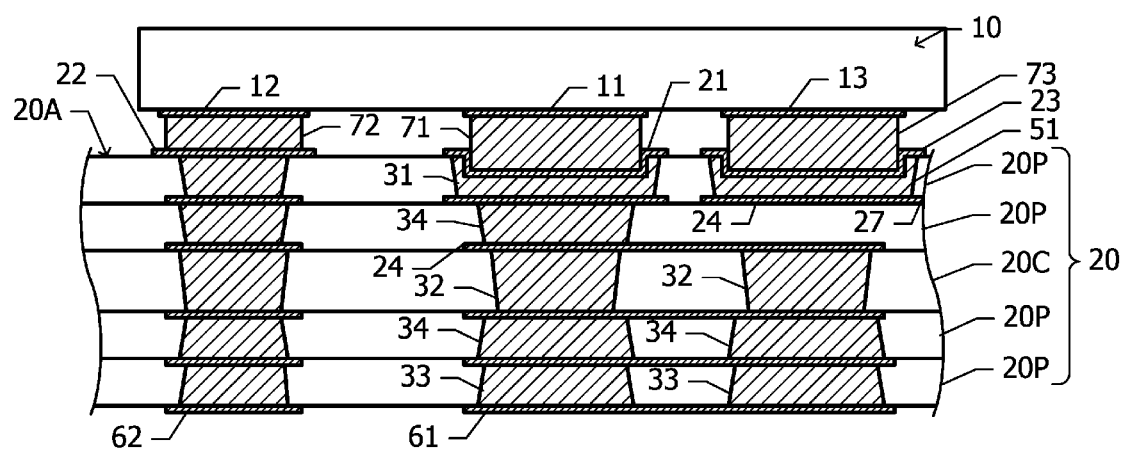
FIG. 8 is a cross-sectional diagram at a dashed-dotted line 8-8 of FIG. 7.

Next, referring to FIG. 7 and FIG. 8, an amplifier module according to a third working example is described. Hereinafter, the description regarding the configuration common to the amplifier module according to the first working example (drawings from FIG. 1 to FIG. 3) is omitted.

FIG. 7 is a diagram illustrating a spatial relationship in a plan view of constituent elements of an amplifier module according to the third working example. In the first working example, the areas of the output terminal 13 on the device side, the output bump 73, and the output terminal 23 on the board side in the plan view are smaller than the areas of the common terminal 11 on the device side, the common bump 71, and the common terminal 21 on the board side in the plan view, respectively. In contrast, in the third working example, the areas of the output terminal 13 on the device side, the output bump 73, and the output terminal 23 on the board side in the plan view are substantially equal to the areas of the common terminal 11 on the device side, the common bump 71, and the common terminal 21 on the board side in the plan view, respectively.

FIG. 8 is a cross-sectional diagram at a dashed-dotted line 8-8 of FIG. 7. In the first working example, the area of the first output via conductor 51 (FIG. 2A) in the plan view is smaller than the area of the first common via conductor 31 in the plan view. Therefore, the upper surface of the first output via conductor 51 is substantially flat. In contrast, in the third working example, the area of the first output via conductor 51 in the plan view is larger than the area of the first input via conductor 41 in the plan view and is substantially equal to the area of the first common via conductor 31 in the plan view. As is the case with the upper surface of the first common via conductor 31, the upper surface of the first output via conductor 51 is lower in an innermost part than in an outer perimeter part. Furthermore, the innermost part of the upper surface of the first output via conductor 51 is lower than the upper surface of the first input via conductor 41. The height of the output bump 73 is higher than the height of the input bump 72 and is substantially equal to the height of the common bump 71.

In the second insulation layer 20P counting from the mounting surface 20A, no via conductor is arranged in a region that overlaps the first output via conductor 51 in the plan view. In the insulation layer 20C at the center and the insulation layers 20P arranged on the lower surface side thereof, the second common via conductors 32, the common via conductor 34, and the third common via conductor 33 are arranged at regions that overlap the first output via conductor 51 in the plan view. The second common via conductors 32, the common via conductor 34, and the third common via conductor 33 arranged at the locations that overlap the first output via conductor 51 in the plan view are connected to the second common via conductors 32, the common via conductor 34, and the third common via conductor 33 arranged at locations that overlap the first common via conductor 31 in the plan view via the inner layer conductor pattern 24, respectively.

An output wiring line 27 is connected to the inner layer conductor pattern 24 that is in contact with the lower surface of the first output via conductor 51. The output wiring line 27 is extended up to a region where the second common via conductor 32 or the like is not present in the plan view.

Next, advantageous effects of the third working example are described. As is the case with the first working example, in the third working example, it also becomes possible to mount the integrated circuit device 10 on the multilayer board 20 with stability and improve the characteristic of heat dissipation from the integrated circuit device 10 to the lower surface of the multilayer board 20. Furthermore, compared with the first working example, in the third working example, the areas of the output bump 73 and the first output via conductor 51 are larger in the plan view. Therefore, it becomes possible to reduce the electric resistance from an output port of the power stage amplifier circuit 111 (FIG. 3) to the lower surface output terminal 63 (FIG. 2A). Because the output resistance of the power stage amplifier circuit 111 decreases, it becomes possible to ensure a higher output and a higher efficiency of the amplifier module.

Needless to say, each working example described above is for illustrative purposes only, and constituent elements of different working examples may be combined or partially exchanged. Substantially same actions and effects produced by substantially same constituent elements of a plurality of working examples will not be repeated in every working example. Furthermore, the present disclosure is not limited to the working examples described above. For example, it would be obvious to a person skilled in the art that various changes, improvements, combinations, or the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplifier module comprising:
a multilayer board;
an integrated circuit device mounted in or on the multilayer board, the integrated circuit device including an amplifier circuit; and
a common bump, an input bump, and an output bump that connect the multilayer board and the integrated circuit device, wherein
the integrated circuit device includes an input terminal on a device side to which a radio frequency signal is input, an output terminal on the device side from which a radio frequency signal is output, and a common terminal on the device side to which a ground potential is given,
the multilayer board includes
a common terminal, an input terminal, and an output terminal on a board side provided on a mounting surface on which the integrated circuit device is mounted, the common terminal, the input terminal, and the output terminal on the board side being arranged at locations that at least partially overlap the common terminal, the input terminal, and the output terminal on the device side in plan view, respectively,
a lower surface common terminal provided on a lower surface opposite to the mounting surface, the lower surface common terminal being arranged at a location that at least partially overlaps the common terminal on the board side in the plan view,
a first common via conductor arranged at a location that at least partially overlaps the common terminal on the board side in the plan view, the first common via conductor being directly connected to the common terminal on the board side,
a second common via conductor arranged at a location that at least partially overlaps the first common via conductor in the plan view, the second common via conductor being arranged at a location deeper than the first common via conductor when viewed from the mounting surface, the second common via conductor being electrically connected to the first common via conductor,
a third common via conductor arranged at a location that overlaps the first common via conductor in the plan view, the third common via conductor being directly connected to the lower surface common terminal, the third common via conductor being electrically connected to the second common via conductor, and
a first input via conductor directly connected to the input terminal on the board side,
the common bump connects the common terminal on the device side and the common terminal on the board side,
the input bump connects the input terminal on the device side and the input terminal on the board side,
the output bump connects the output terminal on the device side and the output terminal on the board side,
an area of the first common via conductor in the plan view is larger than any one of areas of the second common via conductor, the third common via conductor, and the first input via conductor in the plan view, and
an area of the common bump in the plan view is larger than an area of the input bump in the plan view.

2. The amplifier module according to claim 1, wherein
when a direction to which the mounting surface faces is defined to be up, an upper surface of the first common via conductor is lower in an innermost part than in an outer perimeter part,
the inner part of the upper surface of the first common via conductor is lower than an upper surface of the first input via conductor, and
a height of the common bump is higher than a height of the input bump.

3. The amplifier module according to claim 2, wherein
in the plan view, the first common via conductor is larger than the common bump and contains the common bump.

4. The amplifier module according to claim 3, wherein
an area of the third common via conductor in the plan view is larger than or equal to an area of the second common via conductor in the plan view.

5. The amplifier module according to claim 3, wherein
the common terminal on the device side, the common terminal on the board side, the common bump, the first common via conductor, the second common via conductor, and the third common via conductor each have an elongated shape in one direction in the plan view.

6. The amplifier module according to claim 2, wherein
an area of the third common via conductor in the plan view is larger than or equal to an area of the second common via conductor in the plan view.

7. The amplifier module according to claim 2, wherein
the common terminal on the device side, the common terminal on the board side, the common bump, the first common via conductor, the second common via conductor, and the third common via conductor each have an elongated shape in one direction in the plan view.

8. The amplifier module according to claim 2, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

9. The amplifier module according to claim 1, wherein
in the plan view, the first common via conductor is larger than the common bump and contains the common bump.

10. The amplifier module according to claim 9, wherein
an area of the third common via conductor in the plan view is larger than or equal to an area of the second common via conductor in the plan view.

11. The amplifier module according to claim 9, wherein
the common terminal on the device side, the common terminal on the board side, the common bump, the first common via conductor, the second common via conductor, and the third common via conductor each have an elongated shape in one direction in the plan view.

12. The amplifier module according to claim 9, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

13. The amplifier module according to claim 1, wherein
an area of the third common via conductor in the plan view is larger than or equal to an area of the second common via conductor in the plan view.

14. The amplifier module according to claim 13, wherein
the common terminal on the device side, the common terminal on the board side, the common bump, the first common via conductor, the second common via conductor, and the third common via conductor each have an elongated shape in one direction in the plan view.

15. The amplifier module according to claim 13, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

16. The amplifier module according to claim 1, wherein
the common terminal on the device side, the common terminal on the board side, the common bump, the first common via conductor, the second common via conductor, and the third common via conductor each have an elongated shape in one direction in the plan view.

17. The amplifier module according to claim 16, wherein
in the plan view, a width of the first common via terminal is wider than any one of widths of the common bump, the second common via conductor, and the third common via conductor.

18. The amplifier module according to claim 17, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

19. The amplifier module according to claim 16, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

20. The amplifier module according to claim 1, wherein
the multilayer board further includes a first output via conductor directly connected to the output terminal on the board side,
the first output via conductor is arranged at a location that overlaps the output terminal on the board side in the plan view,
an area of the first output via conductor in the plan view is larger than an area of the first input via conductor in the plan view, and an area of the output bump in the plan view is larger than an area of the input bump in the plan view,
an upper surface of the first output via conductor is lower in an innermost part than in an outer perimeter part,
the innermost part of the upper surface of the first output via conductor is lower than an upper surface of the first input via conductor, and
a height of the output bump is higher than a height of the input bump.

* * * * *